United States Patent
Meyer et al.

(10) Patent No.: US 9,656,859 B2
(45) Date of Patent: May 23, 2017

(54) METHOD FOR FABRICATING SUSPENDED MEMS STRUCTURES

(71) Applicants: David J. Meyer, Fairfax, VA (US);
Brian P. Downey, Alexandria, VA (US)

(72) Inventors: David J. Meyer, Fairfax, VA (US);
Brian P. Downey, Alexandria, VA (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 74 days.

(21) Appl. No.: 14/687,943

(22) Filed: Apr. 16, 2015

(65) Prior Publication Data
US 2016/0304340 A1  Oct. 20, 2016

(51) Int. Cl.
*B81C 1/00* (2006.01)

(52) U.S. Cl.
CPC .. *B81C 1/00539* (2013.01); *B81C 2201/0107* (2013.01); *B81C 2201/0132* (2013.01); *B81C 2201/0143* (2013.01); *B81C 2201/0159* (2013.01); *B81C 2201/0177* (2013.01)

(58) Field of Classification Search
CPC .............. B81C 1/00539; B81B 7/0032; G02B 26/0858
See application file for complete search history.

(56) References Cited

U.S. PATENT DOCUMENTS

| 5,374,564 A | 12/1994 | Bruel |
| 2002/0117728 A1 | 8/2002 | Brosnihhan et al. |

FOREIGN PATENT DOCUMENTS

| EP | 1752415 A2 | 2/2007 |
| WO | 2007078989 A2 | 7/2007 |
| WO | 2009133506 A2 | 11/2009 |
| WO | 2009144619 A2 | 12/2009 |

OTHER PUBLICATIONS

Search Report and Written Opinion dated Apr. 21, 2016 in corresponding International Application No. PCT/US2016/012133.
V. Cimalla, J. Pezoldt, and O. Ambacher, "Group III nitride and SiC based MEMS and NEMS: material properties, technology and applications," Journal of Physics D: Applied Physics 40, 6386 (2007).

(Continued)

*Primary Examiner* — Mohammad Choudhry
(74) *Attorney, Agent, or Firm* — US Naval Research Laboratory; Joslyn Barritt (57) ABSTRACT

A process for fabricating a suspended microelectromechanical system (MEMS) structure comprising epitaxial semiconductor functional layers that are partially or completely suspended over a substrate. A sacrificial release layer and a functional device layer are formed on a substrate. The functional device layer is etched to form windows in the functional device layer defining an outline of a suspended MEMS device to be formed from the functional device layer. The sacrificial release layer is then etched with a selective release etchant to remove the sacrificial release layer underneath the functional layer in the area defined by the windows to form the suspended MEMS structure.

19 Claims, 5 Drawing Sheets

(56) References Cited

OTHER PUBLICATIONS

F. Zhao and M.M. Islam, "Fabrication of single-crystal silicon carbide MEMS/NEMS for biosensing and harsh environments," 2011 IEEE 24th International Conference on Micro Electro Mechanical Systems (MEMS), 261 (2011).
F. Niebelschütz, V. Cimalla, K. Tonisch, CH. Haupt, K. Brückner, R. Stephan, M. Hein, and O.Ambacher, "AlGaN/GaN-based MEMS with two-dimensional electron gas for novel sensor applications," Physica Status Solidi C 5 (6), 1914 (2008).
H.W. Choi, K.N. Hui, P.T. Lai, P. Chen, X.H. Zhang, S. Tripathy, J.H. Teng, and S.J. Chua, "Lasing in GaN microdisks pivoted on Si," Applied Physics Letters 89, 211101 (2006).
K. Brueckner, F. Niebelschuetz, K. Tonisch, S. Michael, A. Dadgar, A. Krost, V. Cimalla, O. Ambacher, R. Stephan, and M. A. Hein, "Two-dimensional electron gas based actuation of piezoelectric AlGaN/GaN microelectromechanical resonators," Applied Physics Letters 93, 173504 (2008).
B.S. Kang, S. Kim, F. Ren, J.W. Johnson, R.J. Therrien, P. Rajagopal, J.C. Roberts, E.L. Piner, K.J. Linthicum, S.N.G. Chu, K. Baik, B.P. Gila, C.R. Abernathy, and S.J. Pearton, "Pressure-induced changes in the conductivity of AlGaN/GaN high-electron mobility-transistor membranes," Applied Physics Letters 85 (14), 2962 (2004).
A. Ansari and M. Rais-Zadeh, "A thickness-mode AlGaN/GaN resonant body high electron mobility transistor," IEEE Transactions on Electron Devices 61 (4), 1006 (2014).
D.E. Ibbotson, J.A. Mucha, D.L. Flamm, and J.M. Cook, "Selective interhalogen etching of tantalum compounds and other semiconductor materials," Applied Physics Letters 46, 794 (1985).

METHOD FOR FABRICATING SUSPENDED MEMS STRUCTURES

TECHNICAL FIELD

The present invention relates to fabrication of microelectromechanical system (MEMS) structures, specifically to a new process for fabricating MEMS structures that utilizes an intermediate sacrificial release layer to form a structure having a suspended semiconductor functional layer.

BACKGROUND

The term "MEMS" is used to refer to a class of miniaturized devices, typically produced using microfabrication techniques, which contain both an electrical and a mechanical component, and have a wide variety of potential applications ranging from sensors, electronics, optics, and actuators. While MEMS are used in numerous commercial applications, device performance and capabilities can further be enhanced by the additional availability of new and higher quality materials and fabrication processes.

SiC and compound semiconductors, particularly Group III-Nitride (III-N) materials such as gallium nitride (GaN), aluminum nitride (AlN), indium nitride (InN), and their various alloys, have materials properties that are of great interest for MEMS applications, including high temperature stability and high electric field breakdown due to their wide band gap, excellent mechanical properties, and for III-N materials in particular, excellent piezoelectric properties. See V. Cimalla, J. Pezoldt, and O. Ambacher, "Group III nitride and SiC based MEMS and NEMS: material properties, technology and applications," *Journal of Physics D: Applied Physics* 40, 6386 (2007).

Both SiC and III-N materials are currently used for electronic and optoelectronic devices such as transistors for power and high frequency applications and light-emitting diodes (LEDs) and lasers, and the ability to incorporate the properties of those devices into MEMS structures is of interest.

High quality single-crystal material is required for electronic and optoelectronic devices and while polycrystalline material can be used for purely mechanical devices, polycrystalline material can suffer from diminished mechanical and piezoelectric properties; therefore, a suitable release layer and growth method is required for producing high quality single-crystal functional layers.

MEMS processing requires a sacrificial release layer that can be selectively removed without damaging other layers in the device structure in order to create suspended MEMS structures. While single-crystal SiC and III-N materials are commonly grown on substrates such as SiC, GaN, AN, sapphire, and Si, there are limited methods for fabricating MEMS devices using single-crystal SiC and III-N materials due to the chemical inertness of SiC and III-Ns, making these materials difficult to etch chemically.

One method that overcomes the limitations of wet etching of single-crystal SiC and III-N materials to fabricate MEMS structures is photoelectrochemical (PEC) etching. See U.S. Pat. No. 5,374,564 to E. L. Hu and A. R. Stonas, entitled "Photoelectrochemical undercut etching of semiconductor material"; see also F. Zhao and M. M. Islam, "Fabrication of single-crystal silicon carbide MEMS/NEMS for biosensing and harsh environments," 2011 *IEEE 24th International Conference on Micro Electro Mechanical Systems (MEMS)*, 261 (2011). In PEC etching, an ultraviolet light source and suitable etchant solution are used to selectively etch a layer by oxidizing the layer surface and subsequent etching of the oxide layer. The ultraviolet light illumination is required to generate holes, which is necessary for the oxidation reaction of the layer to proceed.

While PEC etching has been used previously for MEMS fabrication, there are several limitations to the method. Using wet etching to remove the sacrificial layer and release the MEMS structure has an inherent disadvantage as liquid becomes trapped between the MEMS device and underlying layer as the etch proceeds. This can cause the suspended MEMS structure to be pulled into contact with the layer below where it can remain in contact, through a process known as "stiction." This effect can reduce the yield of fabricated devices. Additionally, sample rinsing and drying may cause fragile suspended structures to break, further reducing yield. Another disadvantage of this method is that the MEMS structure design may be limited based on the selectivity of the etching process.

Selective etching of specific layers can be performed in one of two ways, bandgap-selective etching or dopant-selective etching.

In bandgap-selective etching, the photon energy of the ultraviolet light can be selected so that holes will only be photogenerated in the lowest band gap material of the structure, which becomes the sacrificial layer. For example, a ternary InGaN layer can be used as a sacrificial release layer grown beneath a GaN layer due to the smaller band gap of the InGaN layer.

In dopant-selective etching, etch selectivity is achieved through appropriate p-type or n-type doping of the layers, where the p-type layer is the functional layer and the n-type layer is the sacrificial release layer. In the case of p-type doping, the energy bands are bend downwards so holes move away from the surface, and the oxidation process cannot proceed. In the case of n-type doping, the energy bands at the surface of the layer in the etchant solution are bent upwards, allowing photogenerated holes to participate in the oxidation process at the layer surface.

PEC etching, bandgap-selective etching, and dopant-selective etching all have several drawbacks.

For example, in bandgap-selective etching, the material with the lowest band gap will be etched, which may limit the MEMS device design if the layer with the lowest band gap in the structure is to be a functional layer and an epitaxial material with a lower band gap cannot be grown as the sacrificial layer. Similarly, in dopant-selective etching, the n-type layer must be the sacrificial layer, limiting device design.

In addition, although not always necessary, metal electrodes can be patterned on the sample to act as a cathode and to control etch rate, selectivity, and morphology. This may require extra process steps not compatible with the device process, such as additional metal depositions, metal etching, etc. Further processing following the release step may reduce MEMS device yield as the released structures are fragile and may not withstand further processing steps.

Finally, the etchants used in PEC etching, such as potassium hydroxide (KOH) and hydrochloric acid (HCl), are known to etch various metals as well as III-N materials in certain instances. For example, KOH and HCl are known to etch N-polar GaN, but not Ga-polar GaN, and KOH has been used to etch AN and defects in GaN.

Another method used to fabricate suspended single-crystal III-N or SiC MEMS structures is via bulk micromachining where material is removed from the substrate to suspend the functional layers above.

For instance, single-crystal III-N functional layers grown on SiC can be suspended by selectively etching the SiC substrate isotropically beneath the III-N material to release the MEMS structure using a plasma-based dry etch. See F. Niebelschütz, V. Cimalla, K. Tonisch, Ch. Haupt, K. Brückner, R. Stephan, M. Hein, and O. Ambacher, "AlGaN/GaN-based MEMS with two-dimensional electron gas for novel sensor applications," *Physica Status Solidi C* 5 (6), 1914 (2008). However, this method requires a special hard mask to protect the functional MEMS layers, which must be removed chemically after the dry etch release step, creating additional processing steps and potentially reducing device yield since further processing is required after the release step. Additionally, the dry etch must be done at elevated temperatures in order to be isotropic, which may not be not be compatible with the device thermal budget. Furthermore, plasma etching may potentially cause damage to functional layers.

Other release processes that have been used to fabricate suspended single-crystal III-N MEMS structures include wet etching, see H. W. Choi, K. N. Hui, P. T. Lai, P. Chen, X. H. Zhang, S. Tripathy, J. H. Teng, and S. J. Chua, "Lasing in GaN microdisks pivoted on Si," *Applied Physics Letters* 89, 211101 (2006); plasma etching the front side of the Si substrate, see K. Brueckner, F. Niebelschuetz, K. Tonisch, S. Michael, A. Dadgar, A. Krost, V. Cimalla, O. Ambacher, R. Stephan, and M. A. Hein, "Two-dimensional electron gas based actuation of piezoelectric AlGaN/GaN microelectromechanical resonators," *Applied Physics Letters* 93, 173504 (2008); dry etching vias through the backside of the Si substrate, see B. S. Kang, S. Kim, F. Ren, J. W. Johnson, R. J. Therrien, P. Rajagopal, J. C. Roberts, E. L. Piner, K. J. Linthicum, S. N. G. Chu, K. Baik, B. P. Gila, C. R. Abernathy, and S. J. Pearton, "Pressure-induced changes in the conductivity of AlGaN/GaN high-electron mobility-transistor membranes," *Applied Physics Letters* 85 (14), 2962 (2004); and XeF2 etching the front side of the Si substrate, see A. Ansari and M. Rais-Zadeh, "A thickness-mode AlGaN/GaN resonant body high electron mobility transistor," *IEEE Transactions on Electron Devices* 61 (4), 1006 (2014).

These methods also have significant drawbacks.

There are inherent disadvantages when using the substrate as the sacrificial layer including loss of dimensional control in the vertical direction due to the nature of isotropic etching and loss of ability to have functional layers underneath the sacrificial layer, which may be required in certain device structures.

In addition, the choice of substrate may be limited due to availability of bulk micromachining techniques available for a given substrate. For example, III-N materials are commonly grown on sapphire, but the substrate cannot be easily etched.

Moreover, bulk micromachining may not be compatible for functional layers grown homoepitaxially, i.e. GaN grown on GaN substrates or SiC grown on SiC substrates, where etch selectivity between the substrate and functional layers cannot be achieved. As mentioned above, wet chemical etching release methods may decrease yield via stiction or damage from rinsing or drying. Dry etching may cause plasma damage and may require extra processing steps such as hard mask deposition and removal, which may not be compatible with device process flow and may further reduce device yield due to additional processing steps after release.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a process for fabricating a microelectromechanical system (MEMS) structure comprising epitaxial semiconductor functional layers that are partially or completely suspended over a substrate.

In accordance with the present invention, an epitaxial sacrificial release layer is formed on the surface of a substrate and a semiconductor functional layer is formed on the surface of the release layer opposite from the substrate. In many embodiments, the substrate, the sacrificial release layer, and the functional layer are all formed from single-crystal materials, while in some embodiments, one or more of the substrate, the sacrificial release layer, and the functional layer are formed from a polycrystalline or an amorphous material.

The functional device layer is etched to form one or more "windows" in the functional device layer and, in some cases in the sacrificial release layers, the windows defining the outline of a suspended MEMS structure to be formed from the functional device layer. This etching step can be done using any suitable etching technique such as dry plasma, wet chemical, or ion beam etching, but in many embodiments dry etching will be preferred due to the anisotropic nature of the etch process.

The sacrificial release layer is then etched with a selective release etchant to remove the sacrificial release layer underneath the functional layer in the area defined by the windows to form the suspended MEMS structure.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a process for fabricating a microelectromechanical system (MEMS) structure comprising epitaxial semiconductor functional layers that are partially or completely suspended over a substrate.

As described in more detail below, in accordance with the present invention, an epitaxial sacrificial release layer is formed on the surface of a substrate and a semiconductor functional layer is formed on the surface of the release layer opposite from the substrate. In many embodiments, the substrate, the sacrificial release layer, and the functional layer are all formed from single-crystal materials. In other embodiments, one or more of the substrate, the sacrificial release layer, and the functional layer can be formed from a polycrystalline material. In still other embodiments the functional layer can be formed from an amorphous material, with the substrate and sacrificial release layer being formed from a single crystal or a polycrystalline material.

The functional device layer is etched to form one or more "windows" in the functional device layer and, in some cases in the sacrificial release layers, the windows defining the outline of a suspended MEMS structure to be formed from the functional device layer. This etching step can be done using any suitable etching technique such as dry plasma, wet chemical, or ion beam etching, but in many embodiments dry etching will be preferred due to the anisotropic nature of the etch process.

The sacrificial release layer is then etched with a selective release etchant to remove the sacrificial release layer underneath the functional layer in the area defined by the windows to form the suspended MEMS structure.

FIGS. 1A-1F illustrate aspects of an exemplary embodiment of a method for forming a suspended MEMS structure in accordance with one or more aspects of the present invention.

Figure 1A:
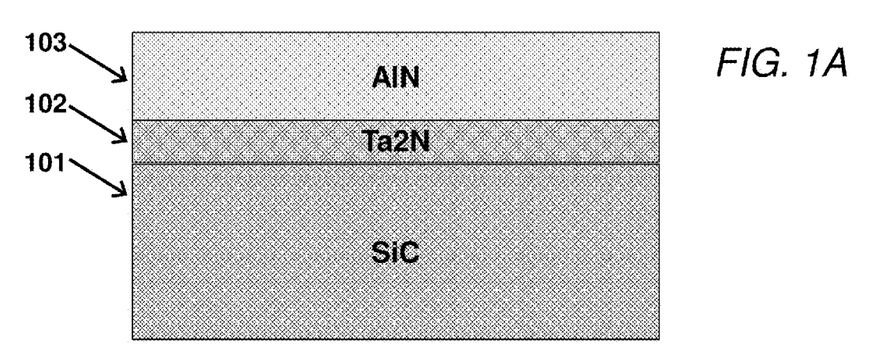
FIGS. 1A-1F are block diagrams illustrating aspects of an exemplary embodiment of a method for forming a suspended MEMS structure in accordance with the present invention.

As shown in FIG. 1A, a process for forming a suspended MEMS begins with growing a thin epitaxial sacrificial release layer 102 and one or more epitaxial Group III-Nitride (M-N) functional device layers 103 on a substrate 101. In many embodiments, sacrificial release layer 102 will have a thickness that is much less than the thickness of the functional device layer 103, but such a disparity in thickness is not an essential aspect of the sacrificial release layer in the process of the present invention.

Sacrificial release layer 102 acts as a template for subsequent growth of functional device layer 103. In accordance with the present invention, all of substrate 101, sacrificial release layer 102, and functional device layer 103 are typically formed from single-crystal materials, though as described below, in some cases, one or more of substrate 101 or sacrificial release layer 102 can be formed from other suitable polycrystalline materials, while functional device layer 103 can be formed from suitable polycrystalline or amorphous materials. Suitable amorphous materials for functional device layer 103 can include oxides such as $SiO_2$, $Al_2O_3$, $TiO_2$ etc., with a transition metal nitride sacrificial release layer often being advantageous for use with an amorphous functional device layer.

In many embodiments, sacrificial release layer 102 will be formed from a single-crystal transition metal nitride (TMN) material and functional device layers 103 will be formed from a single-crystal III-N material. In any case, the material used for sacrificial release layer 102 should be chosen to be compatible with the materials used for substrate 101 and functional device layer 103, such that substrate 101, sacrificial release layer 102, and functional device layer 103 have similar crystal structures with 3- or 6-fold symmetry and similar in-plane lattice constants a to allow for the epitaxial growth of the sacrificial release layer 102 on the substrate 101 and for further epitaxial growth of the functional device layers 103 on the sacrificial release layer 102.

For example, if the functional device layers 103 are single-crystal III-N materials, then substrate 101 can be single-crystal hexagonal SiC, having either the 4H or 6H polytype. In addition, the material for sacrificial release layer 102 should be chosen so that it can be more easily removed by selective etching compared to the substrate 101, functional device layer 103, or any additional layers or materials used in the device structure.

In some embodiments, additional layers, such as one or more additional functional layers or one or more buffer layers may optionally be grown on the substrate 101 prior to the sacrificial release layer 102, where in some embodiments they can be configured to be included as an active part of the device, while in other embodiments they can be configured to induce higher quality material growth of the sacrificial release layer 102 and functional device layer 103.

Device structures that were experimentally demonstrated by the inventors at the Naval Research Laboratory (NRL) included tantalum nitride ($Ta_2N$) and niobium nitride ($Nb_2N$) transition metal nitride (TMN) sacrificial release layers 102 grown by electron beam evaporation molecular beam epitaxy on single-crystal 4H— and 6H—SiC substrates 101. $Ta_2N$, $Nb_2N$, and SiC all have hexagonal crystal structures and similar in-plane lattice constants a, where the lattice constant $aSiC=3.073$ Å, $aTa_2N=3.041$ Å, and $aNb_2N=3.055$ Å, allowing the sacrificial release layer 102 to be grown epitaxially oriented to the SiC substrate 101 in single-crystal form with low defect density.

$Ta_2N$ and $Nb_2N$ have the further advantages that any functional device material layers that can be grown on SiC can also be grown on $Ta_2N$ or $Nb_2N$ with comparable quality due to the similar lattice constants and hexagonal crystal structure of SiC and $Ta_2N$ or $Nb_2N$. For example, GaN and AN have wurtzite crystal structures with $aGaN=3.189$ Å and $aAlN=3.112$ Å, and are commonly grown on SiC substrates due to their similar crystal structures and in-plane lattice constants.

Additionally, thermodynamic stability is maintained between the $Ta_2N$ or $Nb_2N$ sacrificial release layers 102, substrate 101, and the functional device layer(s) 103 due to the high melting points of $Ta_2N$ and $Nb_2N$ (>2000° C.), which is well above the growth temperature of most commonly-used growth methods such as molecular beam epitaxy (MBE), metal organic chemical vapor deposition, atomic layer epitaxy, sputtering, etc.

While sacrificial release layer 102 can be grown by a variety of known methods, in a preferred embodiment, the sacrificial release layer 102 is grown in situ with the subsequently grown functional device layer 103 to prevent surface contamination or oxidation. For example, if the functional device layer 103 is grown via MBE, in a preferred embodiment, the sacrificial release layer is also grown in the same growth chamber, e.g., by using an electron-beam evaporated transition metal source and nitrogen plasma. Irrespective of the method for growing the sacrificial release layer 102 and/or functional device layers 103, substrate 101 should be cleaned and/or pretreated before the next step, using any method such as wet chemical cleaning and outgassing.

Figure 1B:
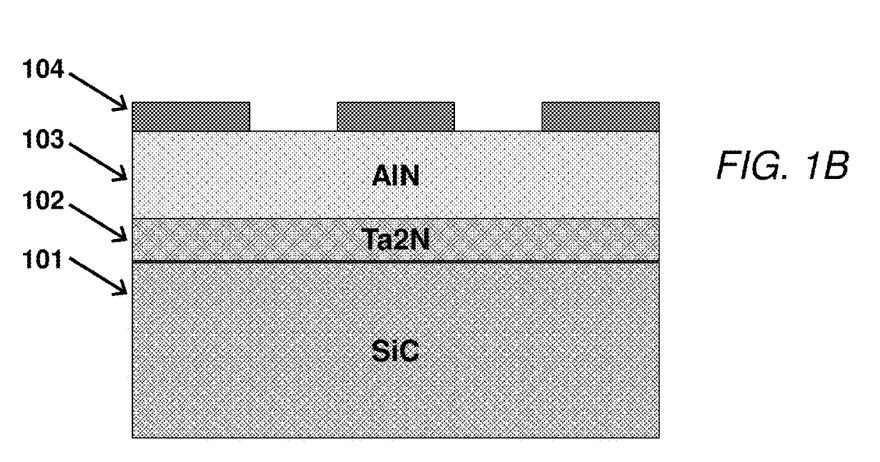

As illustrated in FIG. 1B, in a next step of a method for forming a suspended MEMS structure in accordance with the present invention, the suspended area of the device is first defined by a patterned etch mask 104. Etch mask 104 may comprise any suitable process-compatible material, such as a polymer, metal, insulator, or semiconductor and is typically patterned via photolithography.

Figure 1C:
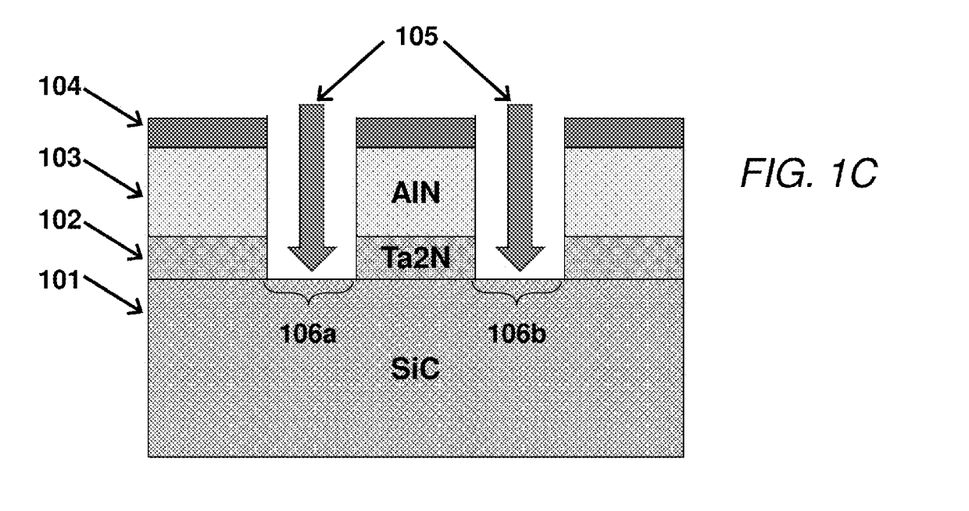
Figure 1D:
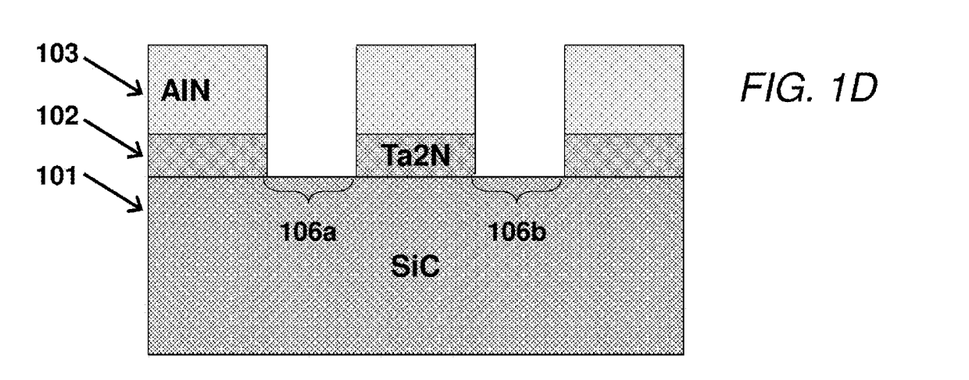

In a next step, illustrated in FIG. 1C, an etchant 105 is used to form one or more "windows" 106a/106b defining the outline of the suspended MEMS structure. The etching process may be done through any suitable etching technique such as dry plasma, wet chemical, or ion beam etching, though in many embodiments dry etching will be preferred due to the anisotropic nature of the etch process. Multiple etch chemistries may be required depending on the material used for the functional device layers 103 and the sacrificial release layer 102. Both Ta2N and Nb2N can be etched using fluorine and chlorine-containing plasma chemistries. Although the etch process does not have to extend to substrate 101 as shown in FIG. 1C, functional device layers 103 must be completely etched to at least the sacrificial release layer 102 so that a selective etchant has access to the sacrificial release layer 102. After etching, etch mask 104 can be removed by a compatible wet or dry etch process, as shown in FIG. 1D.

Figure 1E:
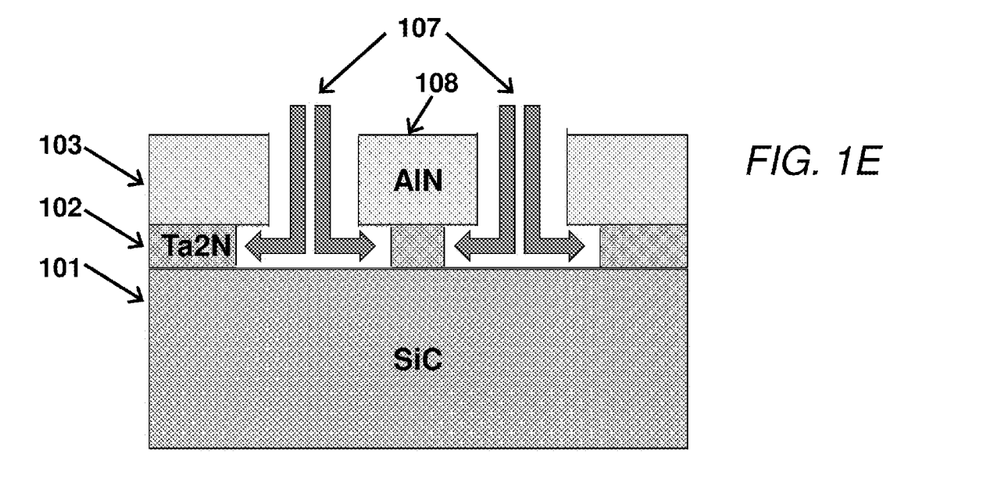
Figure 1F:
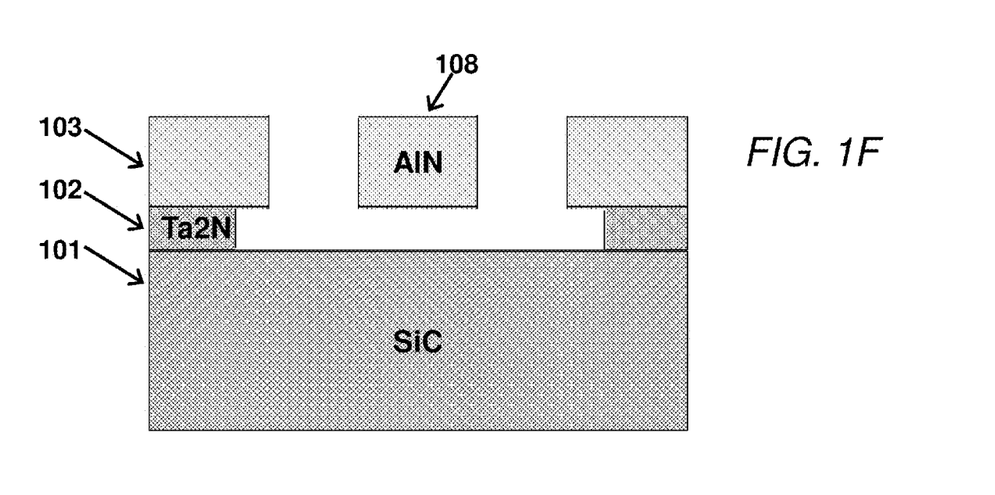

Finally, as illustrated in FIG. 1E, sacrificial release layer 102 is etched using a selective release etchant 107 so as to remove the sacrificial release layer 102 from underneath functional device layer 103 to form the suspended device structure 108. In the embodiment illustrated in FIG. 1F, sacrificial release layer 102 is etched so that semiconductor device structure 108 is completely suspended from the substrate 101 or any other functional or buffer layers below. In other embodiments, sacrificial release layer 102 is etched only to undercut the functional device layer 103 so as to form one or more devices that are only partially suspended over the substrate. Though any suitable etchant can be used, it should be chosen so that it does not react significantly with any other layer in the device structure other than the sacrificial release layer 102, with a gas phase etchant being preferable to a liquid or plasma-based etchant for the release of MEMS structures.

For example, in many embodiments, selective release etchant 107 will be XeF2 gas, since XeF2 gas is commonly used in selective etching of Si for MEMS processing, has been used to etch both Ta2N and Nb2N, and will not damage a wide variety of metals and insulators such as III-N materials and SiC. The XeF2 etching 107 of the sacrificial release layer 102 can be performed in XeF2 etching system such as the Xactix XeF2 release etch system produced by SPTS, where XeF2 gas can be flowed into a vacuum chamber at a known pressure. The etching may be performed under continuous XeF2 flow or by alternating the XeF2 flow and pumping out the etch chamber for a set time and number of cycles (termed pulse mode). An inert gas such as nitrogen (N2) may be flowed along with the XeF2 gas. The etch rate of the Ta2N or Nb2N sacrificial release layer 102 may be tailored by adjusting the pressure of the XeF2 gas and the temperature of the substrate. The etching continues until the functional device layers 103 become suspended to form the final MEMS structure 108 shown in FIG. 1F. Further processing of the device may be required after the release step; however, special care is required not to damage the released structures and reduce device yield.

Figure 2A:
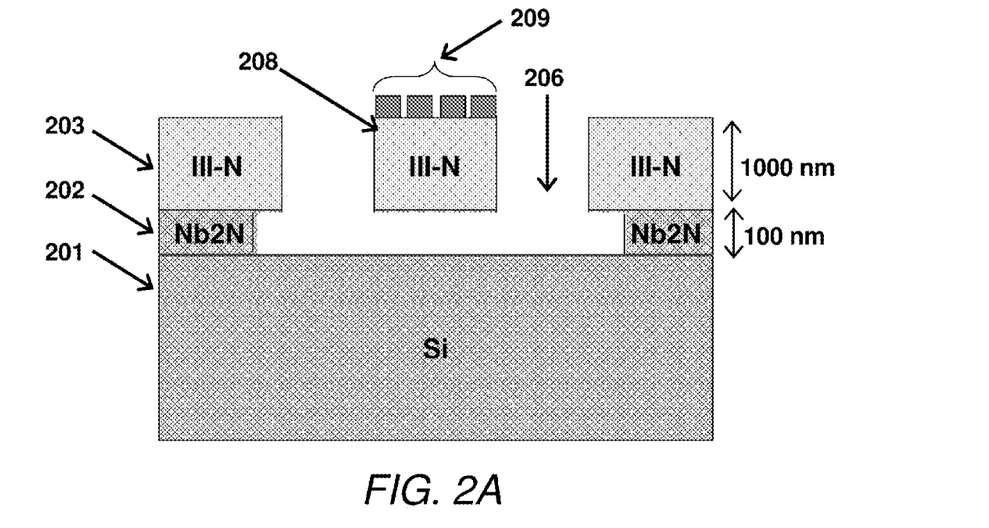
FIGS. 2A-2C illustrate aspects of another exemplary embodiment of a MEMS device comprising suspended III-N layers with patterned interdigitated metal electrodes on a SiC substrate in accordance with one or more aspects of the present invention.
Figure 2B:
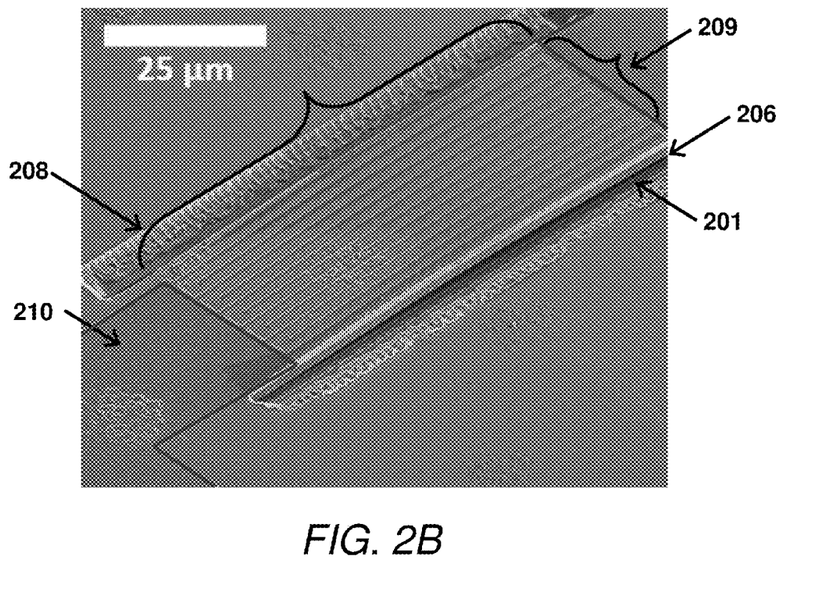
Figure 2C:
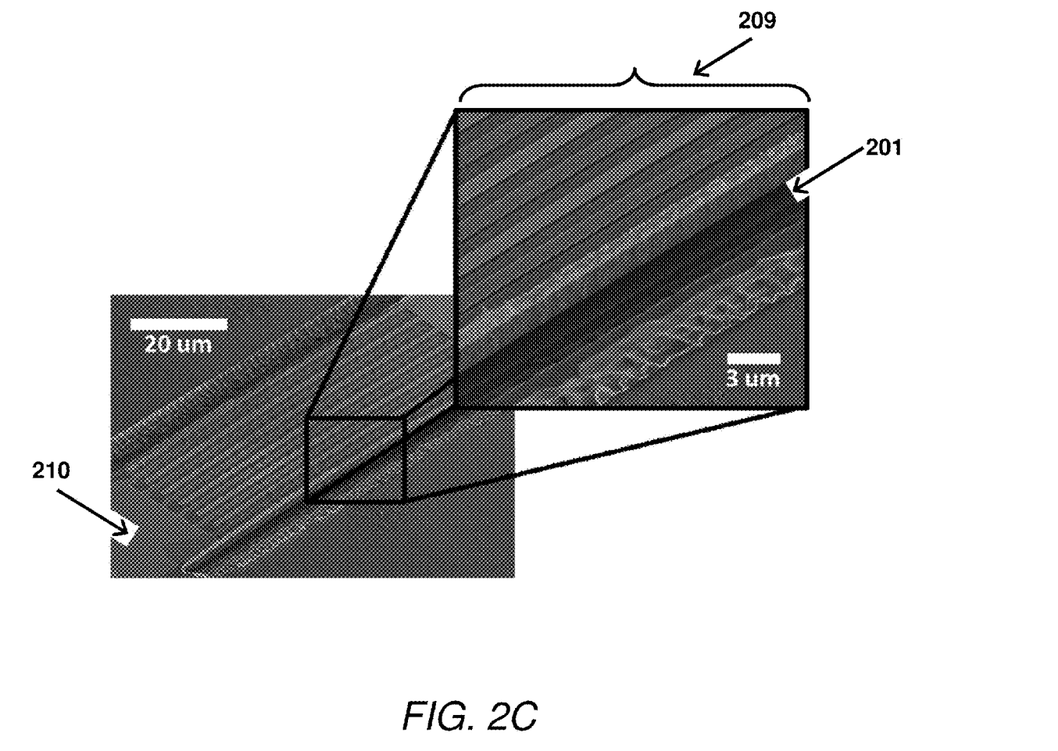

FIGS. 2A-2C illustrate aspects of a device comprising a suspended semiconductor MEMS device structure and further illustrate aspects of the process for forming such a device in accordance with the present invention, where FIG. 2A is a block diagram illustrating aspects of a III-N device structure comprising a plurality of interdigitated metal electrodes suspended over the substrate by selective etching of a Nb2N sacrificial layer using XeF2 gas in accordance with the present invention, FIG. 2B is a SEM micrograph of an exemplary embodiment of such a structure produced by the inventors at NRL, and FIG. 2C shows a magnified view of a portion of the structure illustrated in FIG. 2B.

Thus, in the process for forming the device illustrated in FIG. 2A, a sacrificial release layer 202 of Nb2N is grown on a 6H—SiC substrate 201, with a III-N functional device layer 203 comprising one or more of AlN, GaN, and AlGaN grown on top of the Nb2N layer. In many embodiments, sacrificial release layer 202 will have a thickness much less than the thickness of functional device layer 203. For example, in the exemplary embodiment illustrated in FIG. 2A, Nb2N sacrificial release layer 202 has a thickness of 100 nm and III-N functional device layer 203 has a thickness of 1000 nm. However, other device structures in which the sacrificial release layer and the function device layer have other thicknesses may also be formed and used in the process of the present invention.

Following the formation of sacrificial release layer 202 and functional device layer 203, one or more device components such as interdigitated metal electrodes 209 shown in FIG. 2, can be patterned on III-N functional device layer 203 using any suitable technique such as optical photolithography and metal lift-off. A focused ion beam can then be used to define the outlines of suspended MEMS structure 208 having the metal electrodes 209 on the upper surface thereof, wherein the ion beam defines the outlines of the device by removing the III-N and Nb2N layers 203 and 202 in selected areas such as "window" area 206. Finally, the sample can be subjected to XeF2 gas at room temperature to selectively remove Nb2N sacrificial release layer 202 from substrate 201 and functional device layer 203 and form suspended MEMS device structure 208 (which includes metal electrodes 209) without harming any of the other materials in the structure.

The SEM images shown in FIG. 2B and in the magnified view shown in FIG. 2C illustrate an exemplary embodiment of a structure formed by the process steps described with respect to FIG. 2A. Thus, as shown in FIGS. 2B and 2C, the structure includes a device structure 208 having interdigitated electrodes 209 with the device further including probe pad 210 and being suspended from substrate 201 by means of "window" 206 formed by ion beam etching into functional device layer 203 and sacrificial release layer 202 and the further XeF2 gas etching of sacrificial release layer 202.

Advantages and New Features

There are several advantages of this invention over old methods.

One advantage is that the TMN sacrificial release layer can be etched by XeF2 gas. XeF2 gas etching is a common processing technique used in Si MEMS fabrication. Unlike wet chemical etching, XeF2 etching avoids reduction in device yield due to stiction or damage to devices from the rinsing and drying process. Additionally, no plasma is required for XeF2 etching, eliminating possible plasma-induced damage to the active device. XeF2 is not known to etch either SiC or III-N's and most other metals, insulators, and semiconductors, so the XeF2 etch release step can easily be implemented into most processes. Unlike PEC etching, no extra electrodes or processing steps are required, and there are no limitations on dopants or the bandgap of other layers in the structure.

A second advantage is that the substrate is not used as the sacrificial layer. Due to the close lattice match between the TMN sacrificial release layer and SiC and III-N's, the TMN layer or multiple TMN layers can be grown anywhere in the device stack, allowing for increased device design flexibility. In this case, the substrate is not limited to ones that are easily etched, such as Si or SiC, and any substrate where high quality SiC or III-N material can be grown can be used, including sapphire, AlN, and GaN. Also, by using an epitaxial sacrificial release layer, better control of the undercut depth is possible by controlling the thickness of the sacrificial TMN layer.

Alternatives

There are a number of variations in the above invention.

For example, the sacrificial release layer may be formed from any suitable TMN material such as TaNx, NbNx, WNx, or MoNx or any TMN ternary compound. The sacrificial layer may be deposited by any known growth method, such as sputtering or chemical vapor deposition. While depositing the sacrificial release layer in situ or in vacuo with other device layer(s) may often be preferred, the sacrificial release layer may be deposited ex situ as long as proper cleaning of the substrate, buffer layer(s), and/or functional layer(s) is done prior to growing the sacrificial release layer and proper cleaning of the sacrificial release layer prior is done prior to growing additional functional layer(s) to achieve a native oxide-free surface for further growth.

Also, although the technique used in the method of the present invention is particularly suited for the growth of epitaxial device structures using the III-N material system, which are commonly grown on SiC substrates, the functional device layers are not limited to any particular material system and any suitable material can be used. For example, the substrate and functional device layers are not limited to SiC or III-N materials or even single-crystal materials for epitaxial growth. Any material(s) can be grown on the sacrificial layer as long as the deposited material(s) are in thermodynamic equilibrium with the sacrificial layer at the growth temperature, and a suitable etchant for the sacrificial layer can be found which does not attack the substrate or deposited material(s).

In addition, there are many optional steps after the functional device layers are grown. Devices may be further processed using common semiconductor device processing techniques such as photolithography, metallization, etching, annealing, ion implantation, etc. Due to the high melting point and thermodynamic stability of the TMN sacrificial layer, a large thermal budget is available for subsequent processing steps. Ideally, the MEMS structure should be released after all device processing steps are completed where the suspended structure could be damaged.

Finally, in addition, although XeF2 gas was used in the exemplary embodiments described above, other gases and wet chemical etches may also provide adequate selectivity when etching the sacrificial layer. For example, ClF3 gas has been shown to etch Ta2N, see, e.g., D. E. Ibbotson, J. A. Mucha, D. L. Flamm, and J. M. Cook, "Selective interhalogen etching of tantalum compounds and other semiconductor materials," *Applied Physics Letters* 46, 794 (1985), while suitable wet etch mixtures may include hydrofluoric acid, nitric acid, and/or hydrochloric acid.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A method for fabricating a suspended MEMS structure, comprising:
    providing a substrate comprising a single-crystal material;
    epitaxially growing a sacrificial release layer comprising a transition metal nitride (TMN) material on an upper surface of the substrate to form an epitaxial TMN sacrificial release layer;
    epitaxially growing a functional device layer comprising a Group III-Nitride material or SiC on an upper surface of the TMN sacrificial release layer,
    patterning a portion of the functional device layer to define an outline of a suspended MEMS structure to be formed from a defined portion of the functional device layer;
    in a first etching step, etching the patterned portion of the functional device layer to form one or more windows in the functional device layer and to further define the outline of the suspended MEMS structure; and
    in a second etching step, using a selective release agent, etching the epitaxial TMN sacrificial release layer to remove the epitaxial TMN sacrificial release layer from underneath the defined portion of the functional device layer to form the suspended MEMS structure.

2. The method according to claim 1, wherein at least one of the sacrificial release layer and the functional device layer comprises a single-crystal material.

3. The method according to claim 1, wherein at least one of the sacrificial release layer and the functional device layer comprises a polycrystalline material.

4. The method according to claim 1, wherein the functional device layer comprises an amorphous material.

5. The method according to claim 1, wherein the substrate is one of Si, SiC, sapphire, AlN, and GaN.

6. The method according to claim 1, wherein the epitaxial TMN sacrificial release layer comprises a single-crystal TMN material, a polycrystalline TMN material, or a ternary TMN compound material.

7. The method according to claim 6, wherein the epitaxial TMN sacrificial release layer comprises one of $Nb_2N$, $Ta_2N$, tantalum nitride ($TaN_x$), niobium nitride ($NbN_x$), tungsten nitride ($WN_x$), and molybdenum nitride ($MoN_x$), where x>0.

8. The method according to claim 1, wherein the functional device layer comprises a single-crystal Group III-Nitride material, a polycrystalline Group III-Nitride material, or an amorphous Group III-Nitride material.

9. The method according to claim 1, wherein the functional device layer comprises single-crystal SiC, polycrystalline SiC, or amorphous SiC.

10. The method according to claim 1, wherein the functional device layer is patterned using photo, imprint, or e-beam lithography.

11. The method according to claim 1, wherein the first etching step is performed by one of dry plasma etching, wet chemical etching, or ion beam etching.

12. The method according to claim 1, wherein the first etching step further etches the selective release layer to extend the window to the substrate.

13. The method according to claim 1, wherein the selective release agent used in the second etching step is $XeF_2$ gas.

14. The method according to claim 1, wherein the selective release layer is formed from $Ta_2N$ and the selective release agent is $ClF_3$ gas.

15. The method according to claim 1, wherein the selective release agent is a wet-chemical etchant.

16. The method according to claim 15, wherein the wet-chemical etchant comprises hydrofluoric acid, nitric acid, and/or hydrochloric acid.

17. The method according to claim 1, wherein the selective release layer is formed in situ with formation of the functional device layer.

18. The method according to claim 1, wherein the sacrificial release layer comprises a plurality of material layers, wherein at least one of the material layers is an epitaxial TMN layer.

19. The method according to claim 1, wherein the functional device layer comprises a plurality of material layers, wherein at least one of the material layers comprises a Group III-Nitride or SiC material layer.

* * * * *